(12) United States Patent
Hashimoto

(10) Patent No.: US 7,851,912 B2
(45) Date of Patent: Dec. 14, 2010

(54) SEMICONDUCTOR DEVICE

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/719,234

(22) Filed: Mar. 8, 2010

(65) Prior Publication Data

US 2010/0155945 A1    Jun. 24, 2010

Related U.S. Application Data

(63) Continuation of application No. 11/500,263, filed on Aug. 7, 2006, now Pat. No. 7,705,454.

(30) Foreign Application Priority Data

Aug. 8, 2005    (JP)    ............... 2005-229355

(51) Int. Cl.
    *H01L 21/00*    (2006.01)

(52) U.S. Cl. ................. 257/737; 257/665; 257/750; 257/E23.004

(58) Field of Classification Search ............... 257/665, 257/750, 737, E23.004
    See application file for complete search history.

(56) References Cited

U.S. PATENT DOCUMENTS 5,877,556 A    3/1999    Jeng et al.

| | | |
|---|---|---|
| 6,323,542 B1 | 11/2001 | Hashimoto |
| 6,518,651 B2 | 2/2003 | Hashimoto |
| 7,098,127 B2 | 8/2006 | Ito |
| 7,102,238 B2 | 9/2006 | Noma et al. |
| 7,132,749 B2 | 11/2006 | Ito |
| 7,235,881 B2 | 6/2007 | Hashimoto |
| 7,256,073 B2 | 8/2007 | Noma et al. |
| 2004/0245612 A1 | 12/2004 | Hashimoto |
| 2005/0275115 A1* | 12/2005 | Tanaka et al. ............... 257/786 |
| 2006/0246635 A1 | 11/2006 | Ito |
| 2007/0187825 A1 | 8/2007 | Hashimoto |

FOREIGN PATENT DOCUMENTS

| CN | 1505105 | 6/2004 |
|---|---|---|
| EP | 1 753 026 | 2/2007 |
| JP | 02-272737 | 11/1990 |
| JP | 09-321181 | 12/1997 |
| JP | 2002-231765 | 8/2002 |
| JP | 2004-343088 | 12/2004 |
| JP | 2005-109110 | 4/2005 |
| JP | 2005-136402 | 5/2005 |
| JP | 2005-191605 | 7/2005 |

* cited by examiner

*Primary Examiner*—Leonardo Andújar
(74) *Attorney, Agent, or Firm*—Harness, Dickey & Pierce, P.L.C.

(57) ABSTRACT

A semiconductor device including: a semiconductor chip; a plurality of electrodes formed on the semiconductor chip and arranged along one side of the semiconductor chip; a resin protrusion formed on the semiconductor chip and extending in a direction which intersects the side; and a plurality of electrical connection sections formed on the resin protrusion and electrically connected to the respective electrodes.

7 Claims, 4 Drawing Sheets

SEMICONDUCTOR DEVICE

CROSS-REFERENCE TO RELATED APPLICATIONS

This is a continuation application of U.S. Ser. No. 11/500,263 filed Aug. 7, 2006, which claims priority to Japanese Patent Application No. 2005-229355, filed on Aug. 8, 2005, all of which are hereby incorporated by reference in their entirety.

BACKGROUND OF THE INVENTION

The present invention relates to a semiconductor device.

In order to reduce the size of electronic parts, it is desirable that a semiconductor device have a small external shape. Along with diversification of the roles of semiconductor devices, an increase in the degree of integration of the integrated circuit formed on the semiconductor chip has progressed. Accordingly, the number of pins of the semiconductor chip has also been increased. At present, a semiconductor device is demanded which allows a reduction in the size of the semiconductor device and an increase in the degree of integration of the integrated circuit.

As a semiconductor device which can satisfy such a demand, a semiconductor device in which interconnects are formed on a semiconductor chip has attracted attention (see JP-A-2-272737). This type of semiconductor device can be reduced in size since the external shape of the semiconductor device can be made approximately equal to the external shape of the semiconductor chip.

This semiconductor device is also required to exhibit high reliability. It is expected that it will become difficult to mount the semiconductor device as the size of the semiconductor device is reduced.

SUMMARY

According to one aspect of the invention, there is provided a semiconductor device comprising:

a semiconductor chip;

a plurality of electrodes formed on the semiconductor chip and arranged along one side of the semiconductor chip;

a resin protrusion formed on the semiconductor chip and extending in a direction which intersects the side; and a plurality of electrical connection sections formed on the resin protrusion and electrically connected to the respective electrodes.

DETAILED DESCRIPTION OF THE EMBODIMENT

The invention may provide a semiconductor device exhibiting high reliability and excellent mounting capability.

(1) According to one embodiment of the invention, there is provided a semiconductor device comprising:

a semiconductor chip;

a plurality of electrodes formed on the semiconductor chip and arranged along one side of the semiconductor chip;

a resin protrusion formed on the semiconductor chip and extending in a direction which intersects the side; and a plurality of electrical connection sections formed on the resin protrusion and electrically connected to the respective electrodes.

According to this embodiment, a semiconductor device can be provided in which an electrical short circuit due to migration rarely occurs. Specifically, this embodiment allows provision of a highly versatile semiconductor device exhibiting excellent mounting capability.

(2) In this semiconductor device, the resin protrusion may extend obliquely with respect to the side.

(3) In this semiconductor device, the resin protrusion may extend in a direction which perpendicularly intersects the side.

(4) In this semiconductor device, a surface of the semiconductor chip on which the electrodes are formed may be rectangular; and the side may be a long side of the rectangular surface.

(5) The semiconductor device may comprise two or more of the resin protrusions adjacently arranged in a direction along the side.

(6) The semiconductor device may further comprise another resin protrusion extending along the side.

Embodiments of the invention are described below with reference to the drawings. Note that the invention is not limited to the following embodiments. Note that the invention also includes a configuration in which the following embodiments and modifications are arbitrarily combined.

Figure 1:
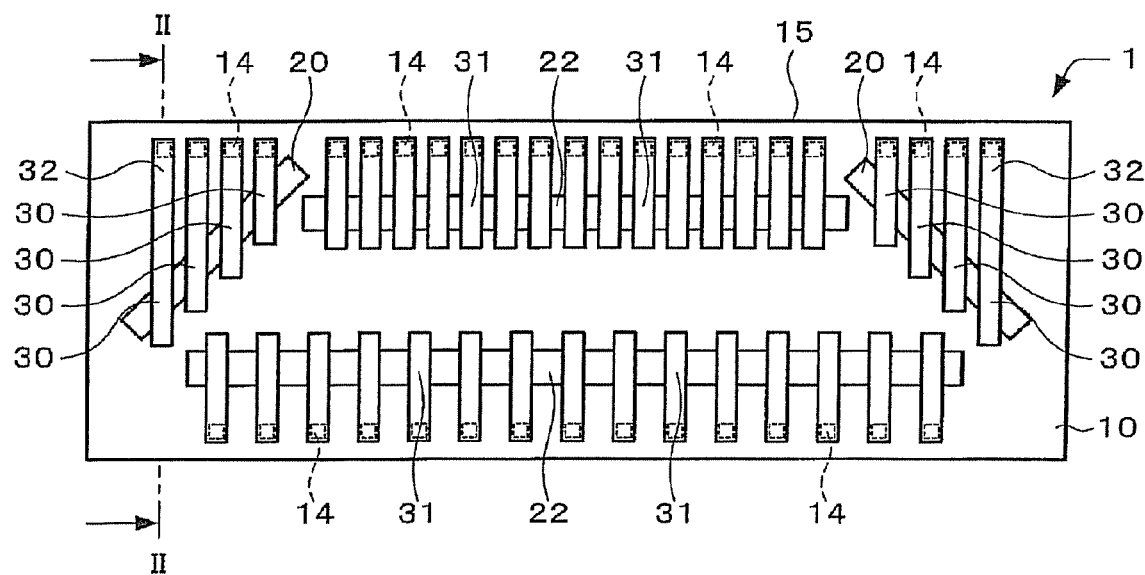
FIG. 1 is a view illustrative of a semiconductor device according to an embodiment of the invention.
Figure 2:
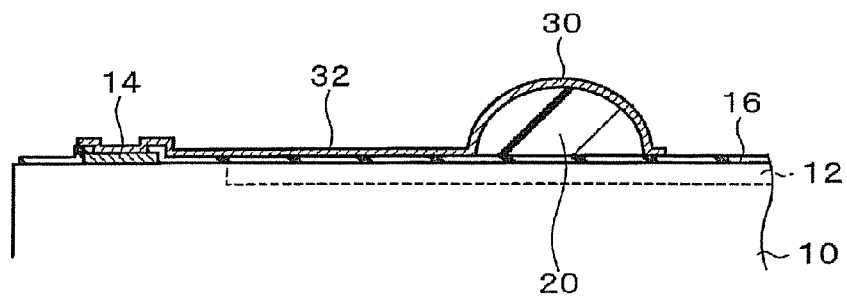
FIG. 2 is a view illustrative of a semiconductor device according to an embodiment of the invention.

FIGS. 1 to 5 are views illustrative of a semiconductor device according to an embodiment to which the invention is applied. FIG. 1 is a top view of a semiconductor device 1 according to one embodiment of the invention. FIG. 2 is a partially enlarged view along the line II-II in FIG. 1.

The semiconductor device according to this embodiment includes a semiconductor chip 10. The semiconductor chip 10 may be a silicon chip, for example. An integrated circuit 12 may be formed on the semiconductor chip 10 (see FIG. 2). The configuration of the integrated circuit 12 is not particularly limited. For example, the integrated circuit 12 may include an active element such as a transistor and a passive element such as a resistor, coil, or capacitor. The surface (active surface) of the semiconductor chip 10 on which the integrated circuit 12 is formed may be rectangular (see FIG. 1). The active surface of the semiconductor chip 10 may be square (not shown).

As shown in FIGS. 1 to 2, the semiconductor device according to this embodiment includes a plurality of electrodes 14. The electrode 14 is formed on the semiconductor chip 10. The electrode 14 may be formed on the active surface of the semiconductor chip 10. The electrodes 14 may be arranged along one side 15 of the semiconductor chip 10. Specifically, the electrodes 14 may be arranged along one side 15 of the active surface of the semiconductor chip 10. When the semiconductor chip 10 (active surface of the semiconductor chip 10) is rectangular, the side 15 may be the long side of the rectangle. The electrodes 14 may be arranged in a row along one side of the semiconductor chip 10. The electrodes 14 may be arranged in a plurality of rows along one side of the semiconductor substrate 10 (not shown). When the active surface of the semiconductor substrate 10 is rectangular, the electrodes 14 may be arranged along (only) the two long sides of the active surface. The semiconductor device may also include electrodes arranged along the short side of the active surface of the semiconductor chip 10 (not shown). The electrodes may be formed only in the edge portion of the semiconductor chip 10 excluding the center portion of the active surface of the semiconductor chip 10. The electrodes may be formed on the active surface of the semiconductor chip 10 in an area array (in the region including the center portion). In this case, the electrodes may be arranged in rows and columns in the shape of a lattice, or may be arranged randomly. In other words, the semiconductor device according to this embodiment may include a plurality of electrodes including the electrodes 14 arranged along the side 15 of the semiconductor chip 10.

The electrode 14 may be electrically connected with the integrated circuit 12. A conductor which is not electrically connected with the integrated circuit 12 may also be referred to as the electrode 14. The electrode 14 may be part of an internal interconnect of the semiconductor chip. The electrode 14 may be formed of a metal such as aluminum or copper. A passivation film 16 may be formed on the semiconductor chip 10. In this case, the electrode 14 may be a region exposed from the passivation film 16 (see FIG. 2). The passivation film may be an inorganic insulating film formed of $SiO_2$, SiN, or the like. The passivation film 16 may be an organic insulating film formed of a polyimide resin or the like.

Figure 7:
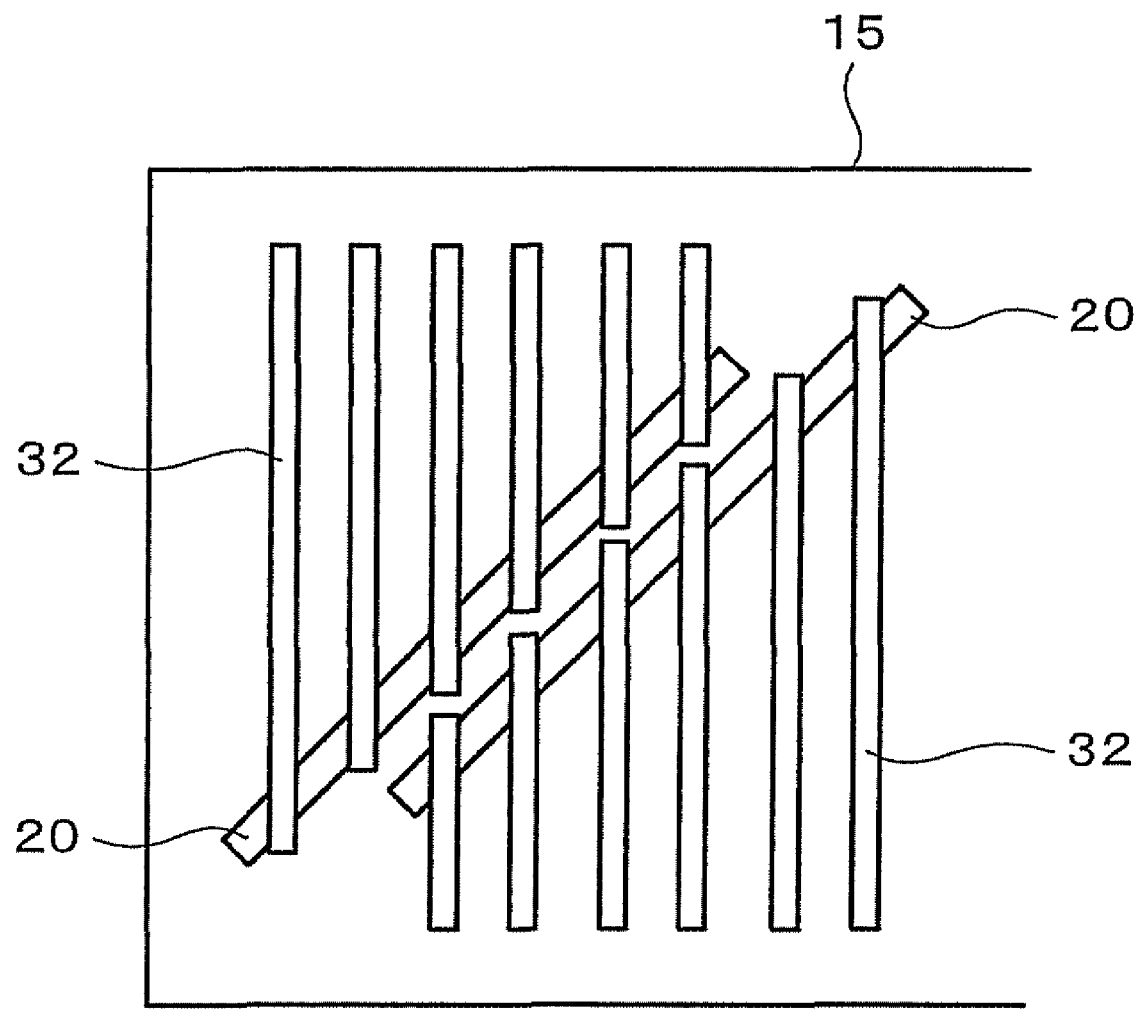
FIG. 7 is a view illustrative of a semiconductor device according to a modification of an embodiment of the invention.

As shown in FIGS. 1 and 2, the semiconductor device according to this embodiment includes a resin protrusion 20. The resin protrusion 20 is formed on the semiconductor chip 10. The resin protrusion 20 is formed on the surface of the semiconductor chip 10 on which the electrode 14 is formed. The resin protrusion 20 may be formed on the passivation film 16. The resin protrusion 20 may be formed to avoid (expose) the electrode 14. The resin protrusion 20 extends in a direction which intersects the side (side 15) of the semiconductor chip 10. As shown in FIG. 1, the resin protrusion 20 may extend obliquely with respect to the side 15. The semiconductor device may include two or more resin protrusions 20 adjacently arranged in a direction along the side 15. In the semiconductor device according to this embodiment, only one resin protrusion 20 may be formed at a position near each of the sides adjacent to the side 15, as shown in FIG. 1. Note that the invention is not limited thereto. Specifically, in the semiconductor device according to this embodiment, two or more resin protrusions 20 may be formed at a position near one side adjacent to the side 15 (see FIG. 7). This allows an increase in the area of the formation region of electrical connection sections 30 described later, whereby a number of connection points can be secured without enlarging the external shape of the semiconductor chip 10, and the degrees of freedom relating to the arrangement of the electrical connection sections 30 can be increased.

As shown in FIG. 1, the semiconductor device according to this embodiment may include another resin protrusion 22 extending along the side 15 of the semiconductor chip 10.

The material for the resin protrusions 20 and 22 is not particularly limited. A known material may be used for the resin protrusions 20 and 22. For example, the resin protrusions 20 and 22 may be formed using a resin such as a polyimide resin, silicone-modified polyimide resin, epoxy resin, silicone-modified epoxy resin, benzocyclobutene (BCB), polybenzoxazole (PBO), or phenol resin.

The semiconductor device according to this embodiment includes a plurality of electrical connection sections 30. The electrical connection section 30 is formed on the resin protrusion 20. As shown in FIG. 1, a plurality of electrical connection sections 30 may be formed on one resin protrusion 20. Specifically, the electrical connection sections 30 may be arranged along a straight line which intersects the side 15 of the semiconductor chip 10. The electrical connection sections 30 may be disposed to have different distances from the side 15 of the semiconductor chip 10. When the semiconductor chip 10 is rectangular, the electrical connection sections 30 may be disposed to have different distances from a long side of the rectangle. The electrical connection section 30 may be electrically connected with the electrode 14. For example, the electrical connection section 30 may refer to part (region overlapping the resin protrusion 20) of an interconnect 32 which extends from the electrode 14 over the resin protrusion 20. In this case, the electrical connection section 30 may refer to part of the interconnect 32 used as an external terminal. The interconnect 32 may be formed to contact the semiconductor substrate 10 (passivation film 16) on both sides of the resin protrusion 20.

The semiconductor device according to this embodiment may further include an electrical connection section 31 formed on the resin protrusion 22. The electrical connection section 31 may be electrically connected with one of the electrodes 14.

The structure and the material for the interconnect 32 (electrical connection sections 30 and 31) are not particularly limited. For example, the interconnect 32 may be formed of a single layer. Or, the interconnect 32 may be formed of a plurality of layers. In this case, the interconnect 32 may include a first layer formed of titanium tungsten and a second layer formed of gold (not shown).

The semiconductor device 1 according to this embodiment may have the above-described configuration. According to the semiconductor device 1, a semiconductor device exhibiting high reliability and excellent mounting capability can be provided. The effects of the semiconductor device 1 are described below.

According to the semiconductor device 1, the resin protrusion 20 extends in a direction which intersects the side 15. This configuration allows the distance between two adjacent interconnects 32 along the surface of the lower portion of the resin protrusion 20 to be increased in comparison with the case where the resin protrusion 20 extends in parallel with the side 15. Therefore, since the effective field intensity can be reduced between two adjacent interconnects 32, an electrical short circuit due to migration rarely occurs.

Figure 3:
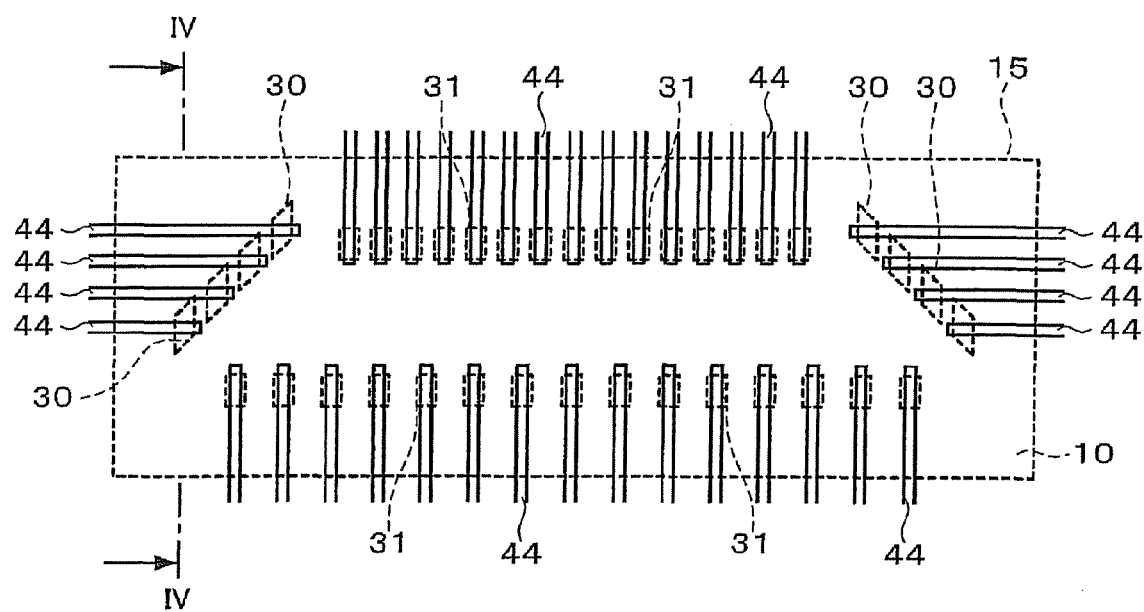
FIG. 3 is a view illustrative of a semiconductor device according to an embodiment of the invention.
Figure 4:
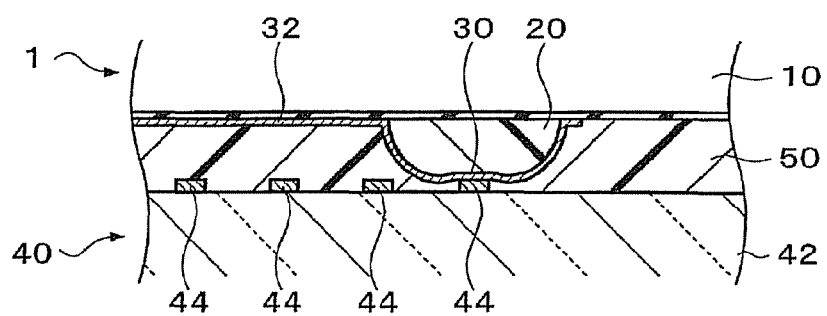
FIG. 4 is a view illustrative of a semiconductor device according to an embodiment of the invention.

According to the semiconductor device 1, a semiconductor device exhibiting excellent mounting capability can be provided. The reasons therefor are described below with reference to FIGS. 3 and 4. FIGS. 3 and 4 are views showing a state in which the semiconductor device 1 is mounted on an interconnect substrate 40. In FIG. 3, which is a view showing a state in which the semiconductor device 1 is mounted on the interconnect substrate 40, only the external shape of the semiconductor chip 10 and the electrical connection sections 30 and 31 are illustrated as the semiconductor device 1 using the broken lines for convenience of illustration. FIG. 4 is a partially enlarged view along the line IV-IV in FIG. 3.

The interconnect substrate 40 is described below. The interconnect substrate 40 may include a base substrate 42 and interconnects 44. The interconnect 44 may refer to part of an interconnect pattern of the interconnect substrate 40. The material for the base substrate 42 is not particularly limited. A substrate formed of an inorganic material may be used as the base substrate 42. In this case, the base substrate 42 may be a ceramic substrate or a glass substrate. When the base substrate 42 is a glass substrate, the interconnect substrate 40 may be part of an electro-optical panel (e.g. liquid crystal panel or electroluminescent panel). In this case, the interconnect 44 may be formed of a metal film or a metal compound film such as indium tin oxide (ITO), Cr, or Al, or a composite of these films. The interconnect 44 may be electrically connected with an electrode which drives a liquid crystal (e.g. scan electrode, signal electrode, or common electrode). The base substrate 42 may be a substrate or a film formed of polyethylene terephthalate (PET). A flexible substrate formed of a polyimide resin may be used as the base substrate 42. As the flexible substrate, a tape used in a flexible printed circuit (FPC) or tape automated bonding (TAB) technology may be used. In this case, the interconnect 44 may be formed by stacking any of copper (Cu), chromium (Cr), titanium (Ti), nickel (Ni), and titanium tungsten (Ti—W), for example.

The semiconductor device 1 may be mounted so that the active surface of the semiconductor chip 10 faces the interconnect substrate 40. As shown in FIG. 4, the electrical connection section 30 of the semiconductor device 1 may contact and be electrically connected with the interconnect 44. This allows the electrical connection section 30 to be pressed against the interconnect 44 due to the elasticity of the resin protrusion 20 (see FIG. 4). Therefore, a semiconductor device with excellent electrical connection reliability can be provided. The semiconductor device 1 may be bonded to the interconnect substrate 40 using an adhesive 50. The semiconductor device 1 may adhere to the interconnect substrate 40 through the adhesive 50. The elastically deformed state of the resin protrusion 20 may be maintained by maintaining the semiconductor device 1 and the interconnect substrate 40 at a specific interval using the adhesive 50. The semiconductor device 1 may be directly mounted on a glass substrate of an electronic module 1000. In this case, the semiconductor device 1 may be mounted on the glass substrate using a chip on glass (COG) mounting method.

According to the semiconductor device 1, the electrical connection sections 30 electrically connected with the electrodes 14 arranged along the side 15 of the semiconductor chip 10 can be arranged in a direction which intersects the side 15 (see FIG. 3). Specifically, the semiconductor device 1 allows the electrical connection sections 30 to be disposed to have different distances from the side 15. Therefore, the interconnect which faces the electrical connection section 30 can be provided to intersect the side adjacent to the side 15 without routing the interconnect in a complicated shape, as shown in FIG. 3. Specifically, as shown in FIG. 3, the semiconductor device 1 allows the interconnects to be pulled out from all sides of the semiconductor chip 10 without routing the interconnect pattern of the interconnect substrate 40 in a complicated shape. Therefore, the semiconductor device 1 can reduce the limitations to the arrangement of the interconnect pattern of the interconnect substrate 40 on which the semiconductor device 1 is mounted. Moreover, since the arrangement of the electrical connection sections 30 can be changed by adjusting the shape of the resin protrusion 20, the semiconductor device 1 can be designed in conformity with an existing interconnect substrate. Specifically, the semiconductor device 1 allows provision of a highly versatile semiconductor device exhibiting excellent mounting capability.

The interconnect electrically connected with the electrical connection section 30 may be provided to intersect the side 15 of the semiconductor chip 10 (not shown). According to the semiconductor device 1, since the electrical connection sections 30 are disposed to have different distances from the side 15, the electrical connection section 30 can be electrically connected with the interconnect which extends to intersect the side 15. Specifically, the semiconductor device 1 allows provision of a highly versatile semiconductor device which can be mounted on various types of interconnect substrates.

Figure 5:
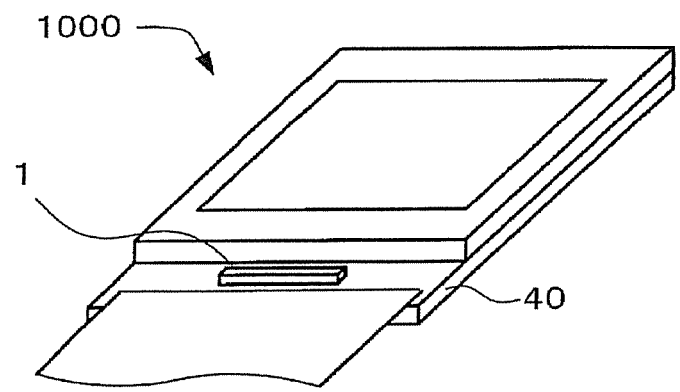
FIG. 5 is a view illustrative of a semiconductor device according to an embodiment of the invention.

FIG. 5 shows the electronic module 1000 on which the semiconductor device 1 is mounted. The electronic module 1000 may be a display device. The display device may be a liquid crystal display device, an electroluminescent (EL) display device, or the like. The semiconductor device 1 may be a driver IC which controls the display device.

Figure 6:
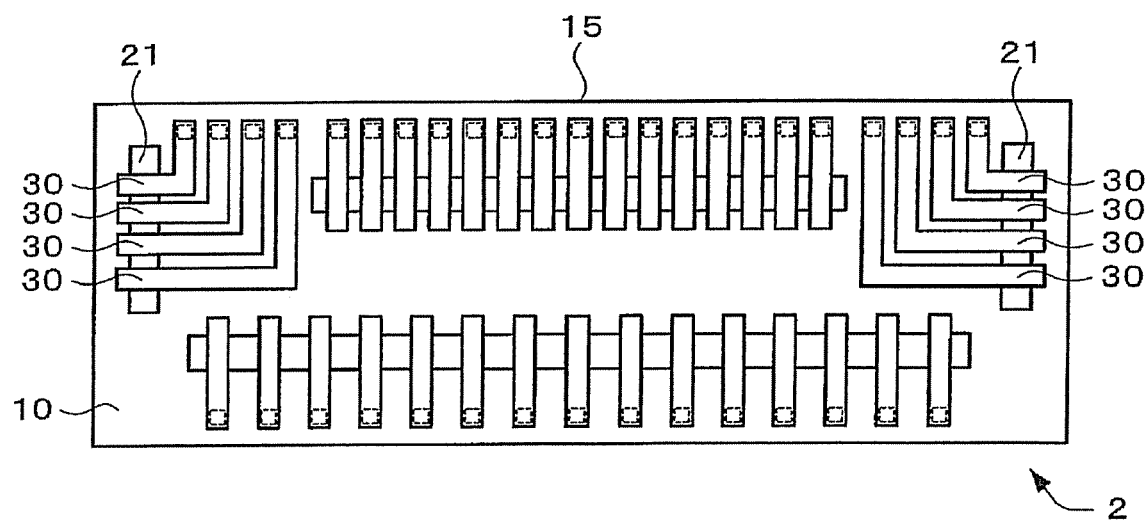
FIG. 6 is a view illustrative of a semiconductor device according to a modification of an embodiment of the invention.

FIG. 6 is a view illustrative of a semiconductor device 2 according to a modification of an embodiment to which the invention is applied. The semiconductor device according to this embodiment includes a resin protrusion 21. The resin protrusion 21 may extend in a direction perpendicularly intersecting the side 15 of the semiconductor chip 10. In the semiconductor device 2, the electrical connection sections 30 may be arranged in a direction which perpendicularly intersects the side 15. This also allows provision of a semiconductor device exhibiting excellent mounting capability.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. An electronic module comprising:
   a semiconductor chip;
   a first electrode formed on the semiconductor chip;
   a second electrode formed on the semiconductor chip;
   a resin protrusion formed on the semiconductor chip;
   a first electrical connection section being provided as a portion of a first interconnect that extends from the first electrode over the resin protrusion, the first electrical connection section formed on the resin protrusion;
   a second electrical connection section being provided as a portion of a second interconnect that extends from the second electrode over the resin protrusion, the second electrical connection section formed on the resin protrusion,
   a first distance between the first electrical connection section and the first electrode is different than a second distance between the second electrical connection section and the second electrode,
   a surface of the semiconductor chip on which the electrodes are formed is rectangular,
   the first electrode and the second electrode being arranged along one side of the semiconductor chip,
   the side being a long side of the rectangular surface,
   the resin protrusion extending in a direction which intersects the side, and the first electrical connection section and the second electrical connection section being arranged along a line which intersects the side in plan view, wherein the resin protrusion extends obliquely with respect to the side in plan view.

2. The electronic module as defined claim 1, further comprising:

a base substrate; and an interconnect formed above the base substrate, the interconnect contacting the electrical connection section.

3. The electronic module as defined in claim 1, comprising:

two or more of the resin protrusions being adjacently arranged in a direction along the side.

4. The electronic module as defined in claim 1, further comprising:

another resin protrusion extending along the side.

5. The electronic module as defined in claim 2, wherein the base substrate is a glass substrate.

6. The electronic module as defined in claim 5, wherein the interconnect includes indium tin oxide.

7. A display device comprising:

a semiconductor chip;

a first electrode formed on the semiconductor chip;

a second electrode formed on the semiconductor chip;

a resin protrusion formed on the semiconductor chip;

a first electrical connection section being provided as a portion of a first interconnect that extends from the first electrode over the resin protrusion, the first electrical connection section formed on the resin protrusion;

a second electrical connection section being provided as a portion of a second interconnect that extends from the second electrode over the resin protrusion, the second electrical connection section formed on the resin protrusion, a first distance between the first electrical connection section and the first electrode is different than a second distance between the second electrical connection section and the second electrode, a surface of the semiconductor chip on which the electrodes are formed is rectangular, the first electrode and the second electrode being arranged along one side of the semiconductor chip, the side being a long side of the rectangular surface, the resin protrusion extending in a direction which intersects the side, and the first electrical connection section and the second electrical connection section being arranged along a line which intersects the side in plan view, wherein the resin protrusion extends obliquely with respect to the side in plan view.

\* \* \* \* \*